United States Patent
Kato et al.

(10) Patent No.: US 11,029,375 B2
(45) Date of Patent: Jun. 8, 2021

(54) CELL MODULE FOR OPTICALLY PUMPED MAGNETIC SENSOR

(71) Applicant: HAMAMATSU PHOTONICS K.K., Hamamatsu (JP)

(72) Inventors: Norihisa Kato, Hamamatsu (JP); Motohiro Suyama, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 71 days.

(21) Appl. No.: 16/589,370

(22) Filed: Oct. 1, 2019

(65) Prior Publication Data
US 2020/0110141 A1 Apr. 9, 2020

(30) Foreign Application Priority Data
Oct. 5, 2018 (JP) ............................. JP2018-189913

(51) Int. Cl.
*G01R 33/26* (2006.01)
*G01R 33/032* (2006.01)

(52) U.S. Cl.
CPC ........... *G01R 33/26* (2013.01); *G01R 33/032* (2013.01)

(58) Field of Classification Search
CPC .............................. G01R 33/26; G01R 33/032
See application file for complete search history.

(56) References Cited

U.S. PATENT DOCUMENTS

| | | | | |
|---|---|---|---|---|
| 7,382,124 B2 * | 6/2008 | Hattori | ............... | A61K 49/1815 324/304 |
| 9,244,137 B2 * | 1/2016 | Kobayashi | ............. | G01R 33/26 |
| 10,107,876 B2 * | 10/2018 | Fujii | ...................... | G01R 33/26 |
| 2006/0263300 A1 * | 11/2006 | Hattori | ............... | A61K 49/1815 424/9.3 |
| 2010/0200739 A1 * | 8/2010 | Anderson | ............... | G21K 1/006 250/251 |
| 2010/0289491 A1 * | 11/2010 | Budker | ................... | G01R 33/26 324/304 |
| 2013/0207649 A1 * | 8/2013 | Mizutani | ............... | G01R 33/032 324/244.1 |
| 2014/0320123 A1 * | 10/2014 | Kobayashi | ............. | G01R 33/26 324/244.1 |
| 2016/0025822 A1 * | 1/2016 | Takahashi | ............ | G01R 33/032 324/244.1 |
| 2016/0109538 A1 * | 4/2016 | Fujii | .................... | G01R 33/032 324/305 |
| 2018/0003778 A1 * | 1/2018 | Miyazawa | ............... | C23C 14/18 |
| 2020/0064421 A1 * | 2/2020 | Kobayashi | ............. | G01R 33/26 |

FOREIGN PATENT DOCUMENTS

JP 2009-236598 A 10/2009

OTHER PUBLICATIONS

Mhaskar, R. et al., "A low-power, high-sensitivity micromachined optical magnetometer," Applied Physics Letters 101, 241105, 2012, pp. 1-4.

* cited by examiner

*Primary Examiner* — Dixomara Vargas
(74) *Attorney, Agent, or Firm* — Faegre Drinker Biddle & Reath LLP

(57) ABSTRACT

A cell module used for a photoexcitation magnetic sensor includes a cell in which an alkali metal is enclosed, a heater which is disposed close to the cell to heat the alkali metal, and a case which forms a decompression region accommodating the cell and the heater.

7 Claims, 3 Drawing Sheets

CELL MODULE FOR OPTICALLY PUMPED MAGNETIC SENSOR

TECHNICAL FIELD

The present disclosure relates to a cell module for an optically pumped magnetic sensor.

BACKGROUND

Optically pumped magnetic sensors (magnetometers) using optical pumping measure fine magnetic field. The optically pumped magnetometers have attracted attention as a new magnetic sensing technology to be substituted for superconducting quantum interference devices (SQUIDs). For example, Japanese Unexamined Patent Publication No. 2009-236598 discloses a magnetic sensor using optical pumping. The magnetic sensor adopts a configuration of a so-called polarimeter-type detector.

Alkali metal vapors which are vapor-like alkali metal atoms produce spin polarization by optical pumping. The spin polarization of alkali metal vapor is affected by magnetic field. As a result, since the spin polarization is rotated by a received torque, the rotation angle reflecting the direction of the spin polarization is changed. The optically pumped magnetic sensor utilizes a phenomenon in which the rotation angle of the spin polarization is changed due to the magnetic field. The alkali metal vapor is obtained by heating the alkali metal enclosed in the interior of the cell. The change of the rotation angle is obtained by irradiating the alkali metal vapor with the probe beam.

The strength of the magnetic field is exponentially decreased as the distance from the measurement point to the measurement object is increased. Therefore, in order to improve the sensitivity of the magnetic field measurement, it is desirable that the optically pumped magnetic sensor and at least the cell are as close as possible to the measurement object. On the other hand, as described above, in order to allow the optically pumped magnetic sensor to be in a state where the magnetic field measurement is possible, it is necessary to generate the alkali metal vapor in the interior of the cell. That is, it is necessary to heat the cell to a high temperature at which the alkali metal can be vaporized. In addition, in some case, according to the measurement object of the magnetic field, there may be a limitation on the temperature at the time of the measurement. As the examples of measurement objects having limitations on temperature conditions, the measurement object of which characteristics change, for example, in a living body and under a high temperature environment may be exemplified. That is, in some cases, according to the measurement object, it may be difficult to bring the cell close to the measurement object. As a result, in some case, highly sensitive magnetic field measurement may be difficult.

The present disclosure describes a cell module for an optically pumped magnetic sensor that enables highly sensitive magnetic field measurement for various measurement objects.

SUMMARY

A cell module for an optically pumped magnetic sensor according to an embodiment of the present disclosure includes a cell in which an alkali metal is enclosed, a heating unit which is disposed close to the cell to heat the alkali metal, and an accommodation unit which forms a decompression region accommodating the cell and the heating unit.

DETAILED DESCRIPTION

Figure 1:
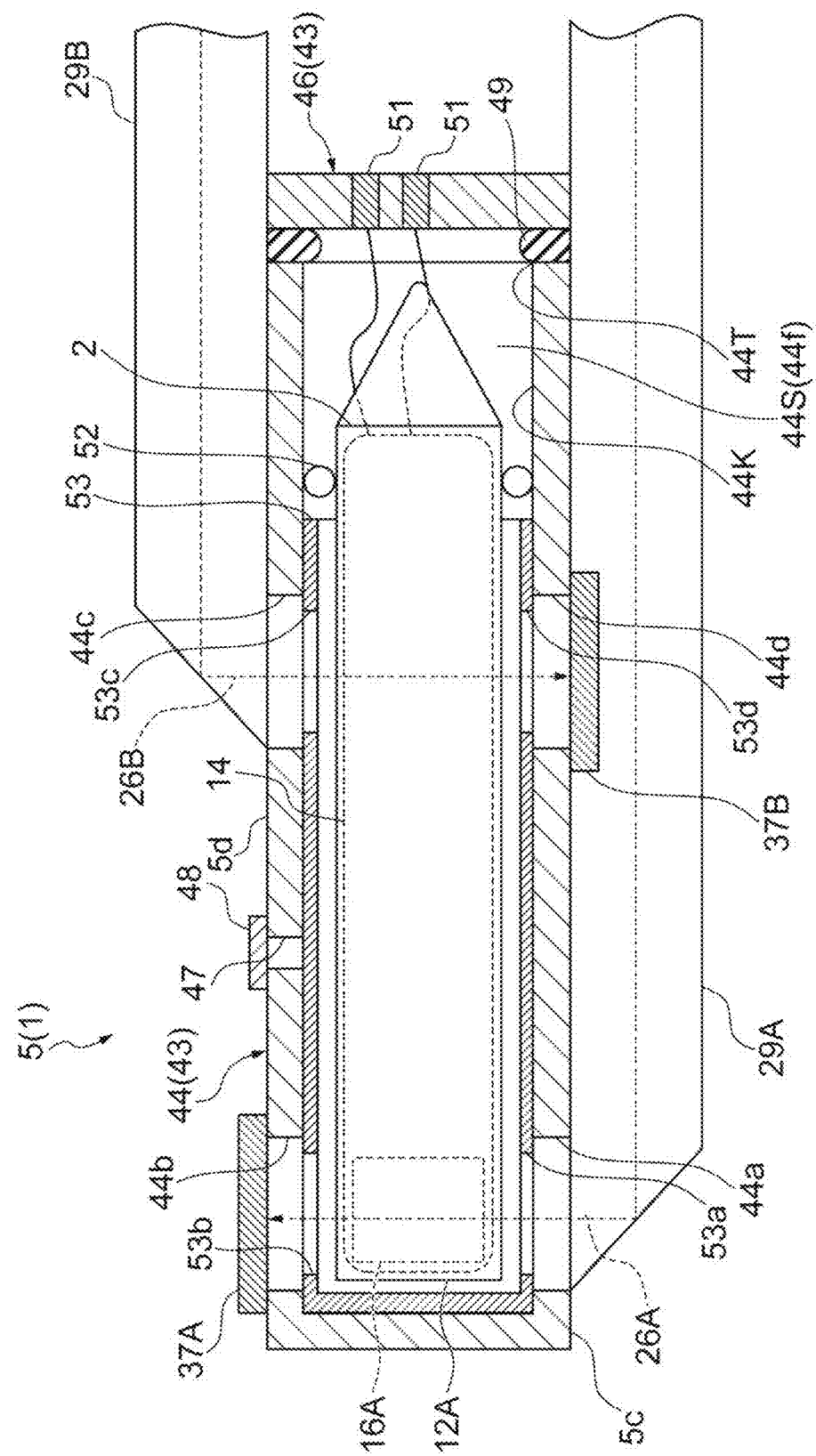
FIG. 1 is a cross-sectional view illustrating a configuration example of applying a cell module to an optically pumped magnetic sensor.

A cell module for an optically pumped magnetic sensor according to an embodiment of the present disclosure includes a cell in which an alkali metal is enclosed, a heating unit which is disposed close to the cell to heat the alkali metal, and an accommodation unit which forms a decompression region accommodating the cell and the heating unit.

The cell module includes a cell in which an alkali metal is enclosed and a heating unit that heats the alkali metal. The cell and the heating unit are accommodated in an accommodation unit which forms a decompression region. According to this configuration, the cell and the heating unit are disposed in the decompression region. Therefore, the heat generated by the cell and the heating unit becomes difficult to move to the accommodation unit. That is, due to the decompression region, a space between the accommodation unit and the cell is thermally insulated, and a space between the accommodation unit and the heating unit is thermally insulated. As a result, since the temperature rise of the accommodation unit is suppressed, the cell module (cell) for the optically pumped magnetic sensor can be brought close to the measurement object. Therefore, highly sensitive magnetic field measurement can be performed on various measurement objects.

The decompression region of the above-described cell module for the optically pumped magnetic sensor may be a vacuum region. Due to the decompression region which is a vacuum region, the heat generated by the cell and the heating unit becomes more difficult to transfer to the accommodation unit.

The heating unit of the above-described cell module for the optically pumped magnetic sensor may be thermally coupled to an outer surface of the cell and disposed so as to be separated from an inner surface of the accommodation unit. Due to such an arrangement, the heat generated by the heating unit is reliably applied to the cell. In addition, the heat generated by the heating unit becomes difficult to transfer to the accommodation unit.

The above-described cell module for the optically pumped magnetic sensor may further include a support portion which supports the cell in the accommodation unit so that an inner surface of the accommodation unit and an outer surface of the cell are separated from each other. According to the support portion, the heat movement from the cell to the accommodation unit can be further suppressed.

In the above-described cell module for the optically pumped magnetic sensor, the cell may have a shape extending in a predetermined axial direction, may include a magnetic field incident portion at one end side in the axial direction, and may be supported by the support portion at the other end side in the axial direction. The support portion suppresses movement of heat of the magnetic field incident portion through the support portion to the accommodation unit. Therefore, according to the support portion, the magnetic field incident portion can be maintained at a high temperature. Moreover, according to the support portion, it is possible to suppress the temperature rise of the accommodation unit in the area close to the measurement object.

The above-described cell module for the optically pumped magnetic sensor may include a heat insulating member between the inner surface of the accommodation unit and the outer surface of the cell. According to the heat insulating member, the heat movement from the cell to the accommodation unit can be further suppressed.

In the above-described cell module for the optically pumped magnetic sensor, the heat insulating member may be a radiation heat reflection member which reflects radiation heat from the outer surface of the cell. Factors of the heat movement in the decompression region include radiation from the outer surface of the cell to the inner surface of the accommodation unit. Therefore, a radiation heat reflection member is used as the heat insulating member. According to the radiation heat reflection member, it is possible to further reduce the heat movement due to the radiation from the cell to the accommodation unit.

The cell module for an optically pumped magnetic sensor of the present disclosure enables highly sensitive magnetic field measurement for various measurement objects.

Hereinafter, embodiments for implementing the cell module for an optically pumped magnetic sensor according to the present disclosure will be described in detail with reference to the attached drawings. In the description of the drawings, the same elements are denoted by the same reference symbols. Redundant description thereof is omitted.

As illustrated in FIG. 1, an optically pumped magnetic sensor 1 has a cell module 5. The cell module 5 accommodates a cell 2. The cell 2 contains an alkali metal and an enclosing gas. An alkali metal vapor is irradiated with a pump beam emitted from a pump beam source (not illustrated). The alkali metal vapor irradiated with the pump beam forms a predetermined spin state. The predetermined spin state is a state in which magnetic field measurement is possible. A probe beam source (not illustrated) irradiates the alkali metal vapor in each of two different measurement areas with a probe beam for detecting a change in a direction of spin polarization (change in rotation angle). According to such a configuration, the optically pumped magnetic sensor 1 constitutes a so-called gradiometer type sensor. Then, the optically pumped magnetic sensor 1 outputs an electric signal according to the intensity of light detected from a light detection unit (not illustrated). The optically pumped magnetic sensor 1 processes an electric signal by using an information processing device (not illustrated) or the like. As a result, the optically pumped magnetic sensor 1 obtains information on the magnetic field in the measurement object.

[Cell Module] The optically pumped magnetic sensor 1 includes a heater 14 (refer to FIG. 1). The heater 14 is attached to the cell 2. The heater 14 vaporizes the alkali metal by heating the alkali metal. As a result, the alkali metal vapor is generated. The temperature of the cell 2 is increased to a higher temperature by the heater 14. In the optically pumped magnetic sensor 1, the density of the alkali metal vapor in the interior of the cell 2 corresponds to the detection sensitivity of magnetic field. Specifically, in order to increase the detection sensitivity of magnetic field, it is necessary to increase the density of the alkali metal vapor.

In order to increase the density of the alkali metal vapor, the temperature of the alkali metal vapor is set to a high temperature. Specifically, the alkali metal is heated by the heater 14. The temperature of the alkali metal vapor is preferably 200° C. or higher.

As illustrated in FIG. 1, the cell module (cell module for an optically pumped magnetic sensor) 5 of the optically pumped magnetic sensor 1 includes the cell 2, the heater (heating unit) 14, and a case (accommodation unit) 43.

The cell 2 is, for example, an enclosing container made of glass. The cell 2 contains an alkali metal (alkali metal vapor) and an enclosing gas. Details of the cell 2 will be described later.

Figure 3:
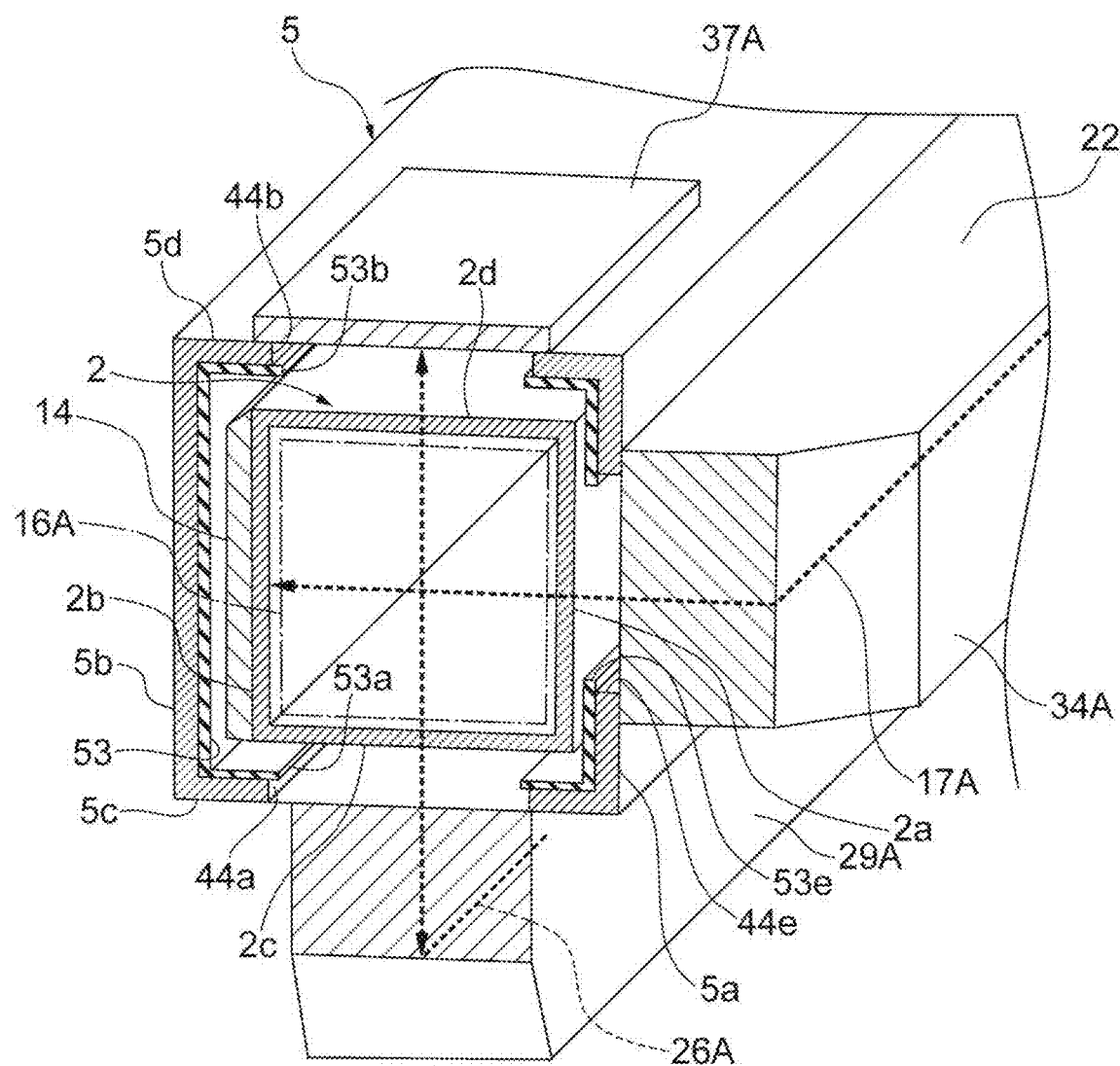
FIG. 3 is a diagram illustrating a relationship between pump beam and probe beam.

The heater 14 is attached to a cell side surface 2b (outer surface, refer to FIG. 3). The heater 14 is thermally coupled to the cell side surface 2b. The heater 14 is separated from an inner surface 44K of a case main body 44 described later. The cell side surface 2b faces a cell side surface 2a (refer to FIG. 3) which is a surface on which the pump beam is incident. The heater 14 heats the cell 2. As a result of the heating, the alkali metal accommodated in the interior of the cell 2 is also heated, and thus, the alkali metal is vaporized. Then, the alkali metal vapor is formed in the interior of the cell 2. That is, the temperature of the cell 2 is increased to a high temperature by the heater 14. In the optically pumped magnetic sensor 1, the density of the alkali metal vapor in the interior of the cell 2 corresponds to the detection sensitivity of magnetic field. Specifically, in order to increase the detection sensitivity of magnetic field, the density of the alkali metal vapor is increased. In order to increase the density of the alkali metal vapor, the temperature of the alkali metal vapor is increased. That is, the alkali metal is heated by the heater 14. The temperature of the alkali metal vapor is preferably 200° C. or higher. In addition, by controlling the temperature of the heater 14, the density of the alkali vapor can be controlled.

The case 43 is a cylindrical member. The cross-sectional shape of the case 43 is substantially rectangular. The case 43 includes a case main body 44 that forms a substantially rectangular internal space 44f and a lid 46 that seals the internal space 44f. The case 43 forms a decompression region 44S. The decompression region 44S corresponds to the internal space 44f sealed by the case main body 44 and the lid 46. The case 43 is a so-called decompression container. The internal pressure of the case 43 is lower than the atmospheric pressure. The interior of the case 43 is, for example, a vacuum region. Then, the heat of the cell 2 and the heater 14 becomes difficult to move to the case 43. As a result, the temperature rise of the case 43 can be suppressed while heating the cell 2 to a high temperature state and maintaining the high temperature state. According to the vacuum heat insulation structure, it is possible to miniaturize the configuration in which a heat insulating material is wound around the cell 2. Furthermore, the heat supplied from the heater 14 to the cell 2 becomes difficult to lose. As a result, the electric power to be supplied to the heater 14 to maintain the temperature of the cell 2 can be reduced. The case main body 44 has an exhaust port 47 for evacuation and a sealing lid 48 used for decompression and sealing operations. According to these configurations, the cell 2 can be disposed close to the measurement object. Furthermore, since the cell 2 can be heated to a high temperature, the detection sensitivity can be improved.

The case main body 44 is made of a nonmagnetic material such as a ceramic. The case main body 44 has the internal space 44f that constitutes the decompression region 44S and an opening 44T. The case main body 44 includes a distal end side on which a magnetic field incident portion 12A provided on one end side (distal end side) of the cell 2 described later is disposed. The distal end side is closed. The opening 44T is provided on the other end side of the case main body 44. The cell 2 and the heater 14 are inserted into the interior of the case main body 44 from the opening 44T. The opening of the case main body 44 is sealed by the lid 46.

The case main body 44 has six window holes. As illustrated in FIG. 1, on the distal end side of the case main body 44, window holes 44a, 44b, and 44e (refer to FIG. 3) are provided. On the base end side of the case main body 44, window holes 44c and 44d are provided. Although another window hole is further provided on the base end side, the window hole is omitted in illustration. The window holes 44a, 44b, 44c, 44d, and 44e guide the pump beam and the probe beam to the interior of the case main body 44. As a result, the pump beam and the probe beam are supplied to the cell 2. The window holes 44a and 44d are provided in a case side surface 5c. The window holes 44b and 44c are provided in a case side surface 5d which is a surface facing the case side surface 5c. The window hole 44e is provided in a case side surface 5a. The case side surface 5a connects the case side surface 5c and the case side surface 5d. The case side surface 5a intersects the case side surface 5c and the case side surface 5d substantially perpendicularly.

The lid 46 is a so-called interposer. The lid 46 is fixed to the case main body 44 through a sealing material 49. The lid 46 has a terminal 51. The terminal 51 supplies electric power to the heater 14 via a feeder line. Similarly to the case main body 44, the lid 46 is made of a nonmagnetic material.

The size of the decompression region 44S (internal space 44f) is larger than the external dimensions of the cell 2. When the cell 2 is accommodated in the decompression region 44S, the cell 2 is separated from the inner surface 44K of the case main body 44. That is, a gap surrounding the periphery of the cell 2 is formed. The decompression region 44S is a decompressed space. Therefore, the heat movement in the decompression region 44S is dominated by radiation. That is, the heat movement due to heat transfer and heat conduction is negligible. According to these gaps, the heat movement from the cell 2 to the case main body 44 can be suppressed.

The cell module 5 has a support portion 52 supporting the cell 2. As described above, the support portion 52 secures the gap between the cell 2 and the case main body 44. The support portion 52 may be, for example, an annular member fitted to the outer shape of the cell 2. The support portion 52 may be a protrusion integrally formed with the case main body 44 and protruding from the inner surface 44K of the case main body 44. The cross-sectional shape of the support portion 52 may be circular. The cross-sectional shape of the support portion 52 may be rectangular. The cross-sectional shape of the support portion 52 may be triangular. The cross-sectional shape of the support portion 52 may be semicircular. It is preferable to allow the area of the portion being in contact with the support portion 52 and the cell 2 to be as small as possible. For example, in a cross section of the cell in a direction horizontal to the axial direction, the cross-sectional area of the contact area between the support portion 52 and the cell 2 may be equal to or smaller than (more preferably smaller than) the cross-sectional area of the area of the case main body 44 on the side closer to on the inner surface 44K. In addition, the support portion 52 may be in point contact with the cell 2 by a plurality of protrusions. As a result, the heat movement from the cell 2 to the case main body 44 through the support portion 52 can be suppressed. In addition, the support portion 52 is provided on the other end side (in the vicinity of the opening 44T) of the case main body 44 so as to support the cell 2 on the other end side (base end side) of the cell 2 described later. In other words, the support portion 52 is provided on the other end side (in the vicinity of the opening 44T) of the case main body 44 so as to support the cell 2 on the end side of the cell 2 separated from the magnetic field incident portion 12A. As a result, the heat of the magnetic field incident portion 12A can be suppressed from moving to the case main body 44 through the support portion 52. That is, it is possible to suppress the temperature rise on one end side of the case main body 44 which is a region close to the measurement object while maintaining the magnetic field incident portion 12A at a high temperature. In other words, it is possible to suppress the temperature rise on the distal end side of the case main body 44 which is an area close to the measurement object while maintaining a measurement area 16A which is an internal space of the cell 2 adjacent to the magnetic field incident portion 12A at a high temperature. Moreover, it is preferable that the support portion 52 is configured with a material that is stable also in a high temperature environment like the heating temperature of the cell 2. The stable material includes, for example, a material that does not melt in a high temperature environment, a material that does not generate a gas in a high temperature environment, or the like. Furthermore, it is more preferable that the support portion 52 is configured with a material having an elasticity which can absorb the thermal expansion of the cell 2.

The radiation heat reflection film (heat insulating member) 53 is provided on the inner surface 44K of the case main body 44. The radiation heat reflection film 53 further reduces the heat movement from the cell 2 to the case main body 44. Radiation occurs between one side and the other side facing each other. The radiation heat reflection film 53 is provided on the inner surface 44K of the case main body 44 facing the outer surface of the cell 2. The radiation heat reflection film 53 provided on the inner surface 44K is separated from the outer surface of the cell 2. Furthermore, the radiation heat reflection film 53 provided on the inner surface 44K is separated from the heater 14. For example, a nonmagnetic metal film may be adopted as the radiation heat reflection film 53. The radiation heat reflection film 53 may be provided as necessary. It is preferable that the radiation heat reflection film 53 is provided so as to surround the region of the cell 2 where the heater 14 is disposed as wide as possible. In the present disclosure, the radiation heat reflection film 53 is not provided in the region corresponding to the support portion 52 out of the region of the cell 2 where the heater 14 is disposed. The radiation heat reflection film 53 may be provided in a region corresponding to the support portion 52. In addition, the radiation heat reflection film 53 may be provided on the inner surface 44K of the case main body 44 on the other end side (base end side).

The radiation heat reflection film 53 has window holes 53a, 53b, 53c, 53d, and 53e. The window holes 53a, 53b, 53c, 53d, and 53e correspond to the window holes 44a, 44b, 44c, 44d, and 44e of the case main body 44, respectively. The window hole 53a communicates with the window hole 44a. The window hole 53b communicates with the window hole 44b. The window hole 53c communicates with the window hole 44c. The window hole 53d communicates with the window hole 44d. The window hole 53e communicates with the window hole 44e. In a case where the radiation heat reflection film 53 has an optical characteristic of transmitting the pump beam and the probe beam, the window holes 53a, 53b, 53c, 53d, and 53e may not be provided.

Optical paths of the pump beam and the probe beam will be described with reference to FIGS. 1 and 3. The pump beam emitted from the pump beam source (not illustrated) is incident on the light waveguide unit 22 configured with a columnar optical member. The pump beam incident on the light waveguide unit 22 is divided into a first pump beam 17A and a second pump beam (not illustrated) by an optical system (not illustrated) provided in the light waveguide unit 22. Then, the interior of the cell 2 is irradiated with the first pump beam 17A and the second pump beam. As a result, the alkali metal vapor is excited. On the other hand, the probe beam emitted from the probe beam source (not illustrated) is split into a first probe beam 26A and a second probe beam 26B by an optical system (not illustrated). The first probe beam 26A passes through a light waveguide unit 29A configured as a columnar optical member. In addition, the second probe beam 26B passes through a light waveguide unit 29B configured as a columnar optical member. Then, the interior of the cell 2 is irradiated with the first and second probe beams 26A and 26B. The first and second probe beams 26A and 26B which are incident on the interior of the cell 2 pass through the alkali metal vapor. When passing through the alkali metal vapor, the first and second probe beams 26A and 26B acquire information on the magnetic field. Next, the first and second probe beams 26A and 26B are reflected by mirrors 37A and 37B which are reflection units, respectively. Next, the reflected first and second probe beams 26A and 26B are again incident on the light waveguide units 29A and 29B, respectively. Then, the first and second probe beams 26A and 26B incident on the light waveguide units 29A and 29B are guided to a light detection unit (not illustrated). More specifically, the light waveguide unit 22 is fixed on the case side surface 5a. The first pump beam 17A passes through the window holes 44e, the window hole 53e, and the decompression region 44S. After that, the measurement area 16A in the interior of the cell 2 is irradiated with the first pump beam 17A from the cell side surface 2a. On the other hand, the light waveguide unit 29A is fixed on the case side surface 5c. The first probe beam 26A passes through the window hole 44a, the window hole 53a, and the decompression region 44S. After that, the measurement area 16A in the interior of the cell 2 is irradiated with the first probe beam 26A from a cell side surface 2c. The first probe beam 26A being emitted from a cell side surface 2d and acquiring the information on the magnetic field passes through the decompression region 44S, the window hole 53b, and the window hole 44b. Then, the first probe beam 26A is reflected by the mirror 37A. The reflected first probe beam 26A reversely travels the same path. Then, the first probe beam 26A is incident on the light waveguide unit 29A again. As a result, the first probe beam 26A is guided to a light detection unit (not illustrated). Similarly, the light waveguide unit 29B is fixed on the case side surface 5d. The second probe beam 26B passes through the window hole 44c, the window hole 53c, and the decompression region 44S. After that, the interior of the cell 2 is irradiated with the second probe beam 26B from the cell side surface 2d. The second probe beam 26B being emitted from the cell side surface 2c and acquiring the information on the magnetic field passes through the decompression region 44S, the window hole 53d, and the window hole 44d. After that, the second probe beam 26B is reflected by the mirror 37B. The reflected second probe beam 26B reversely travels the same path. Then, the second probe beam 26B is incident on the light waveguide unit 29B again. As a result, the second probe beam 26B is guided to a light detection unit (not illustrated).

The cell module 5 can allow the optically pumped magnetic sensor 1 to be disposed close to the measurement object. In addition, the cell module 5 can be miniaturized. Furthermore, since the cell module 5 can allow the cell 2 to be a high temperature, the detection sensitivity can also be improved.

Figure 2:
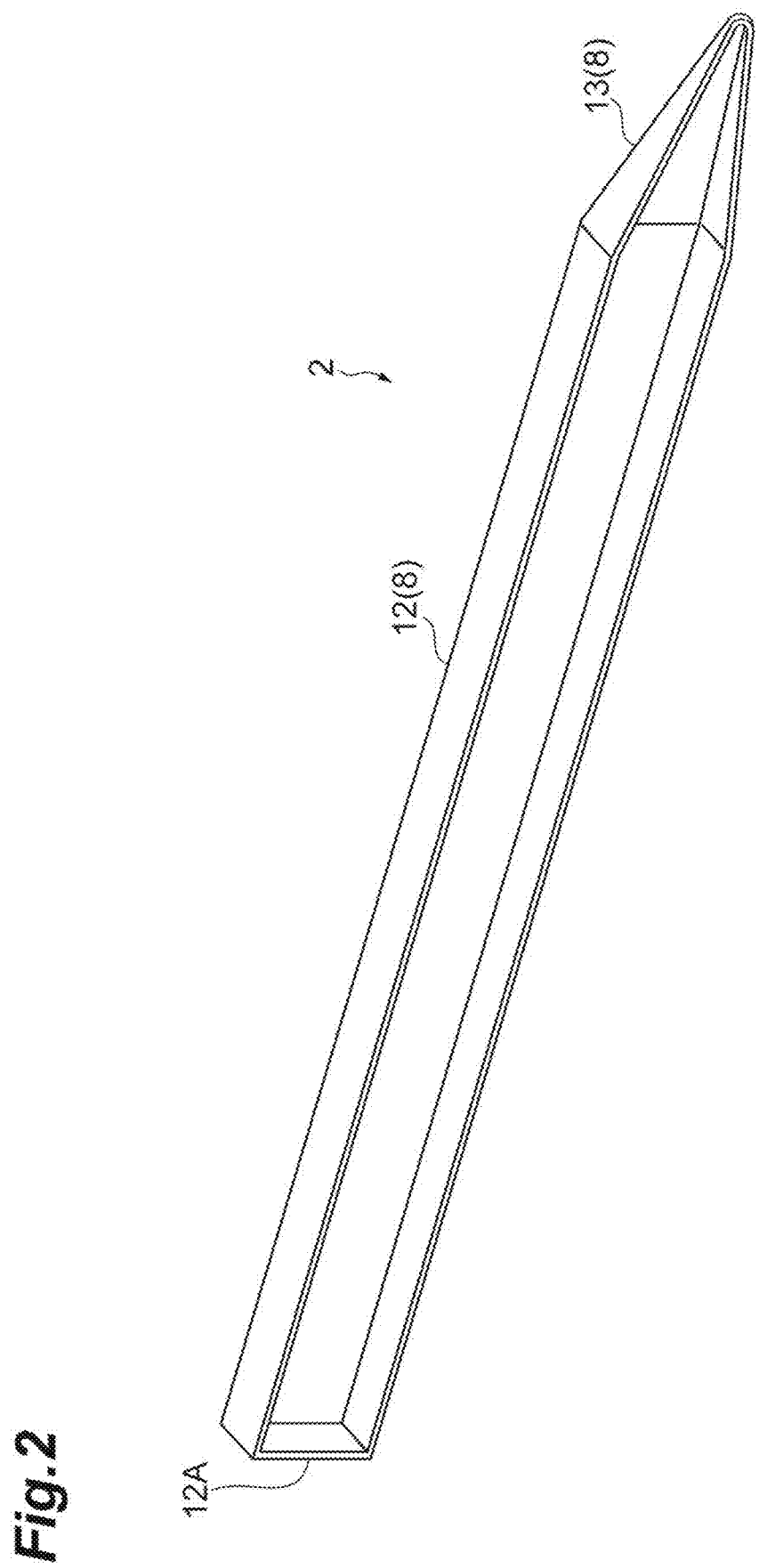
FIG. 2 is a perspective view illustrating a cross section of a cell provided in the optically pumped magnetic sensor of FIG. 1.

[Cell] As illustrated in FIG. 2, the cell 2 has a glass substrate 8. The glass substrate 8 forms a space sealing an alkali metal (alkali metal vapor) and an enclosing gas.

In the present disclosure, the alkali metal is potassium (K). In addition to potassium, lithium (Li), sodium (Na), rubidium (Rb), or cesium (Cs) may be adopted as the alkali metal. In addition, the alkali metal may contain a plurality of kinds of these metals. In addition, the smaller atomic number of an alkali metal is more preferable for higher sensitivity. Therefore, the alkali metal to be enclosed preferably contains potassium.

The enclosing gas controls the alkali metal vapor. As the enclosing gas, an inert gas is preferable. For example, helium (He), neon (Ne), argon (Ar), krypton (Kr), xenon (Xe), nitrogen ($N_2$), hydrogen ($H_2$) may be adopted as a source of an inert gas. The enclosing gas may be a mixed gas of these gases. As the enclosing gas, atoms having low reactivity with the alkali metal atoms and having smaller atomic numbers are more suitable. Therefore, it is preferable to adopt helium as the enclosing gas. The enclosing pressure of the enclosing gas is preferably about 0.1 atm or more and 4 atm or less.

As the material of the glass substrate 8, for example, quartz, sapphire, silicon, Kovar glass, or borosilicate glass (Pyrex (registered trademark) glass) may be adopted. In particular, a permeability coefficient of helium (He) of the Kovar glass is lower by one digit than that of the Pyrex (registered trademark) glass. Therefore, the thickness of the glass substrate 8 can be reduced. As a result, the cell 2 can be miniaturized. Due to such a material, the pump beam and the probe beam, which are beams for the magnetic field measurement, can be allowed to be favorably transmitted. Therefore, the pump beam and the probe beam can be suitably supplied to the alkali metal vapor in the interior of the cell 2.

The glass substrate 8 has a cylindrical glass main body portion 12 and a sealing-off portion 13. The glass main body portion 12 has a substantially rectangular parallelepiped shape extending in a predetermined axial direction. In addition, the glass main body portion 12 exhibits a cylindrical shape. The cross section of the glass main body portion 12 in the direction perpendicular to the axis has, for example, a square shape. One end (distal end) of the glass main body portion 12 is a flat surface. One end of the glass main body portion 12 is a magnetic field incident portion 12A facing the measurement object. At the other end (base end) of the glass main body portion 12, the sealing-off portion 13 is formed.

The relationship between the first pump beam 17A and the first probe beam 26A will be described with reference to FIG. 3. As illustrated in FIG. 3, the first pump beam 17A is emitted from the light waveguide unit 22 provided on the case side surface 5a. The first pump beam 17A travels in the normal direction of the cell side surface 2a. Then, the first pump beam 17A reaches the cell side surface 2b on the opposite side where the heater 14 is provided. The first pump beam 17A may excite the alkali metal vapor in the measurement area 16A. Therefore, the cell 2 may have one input portion for allowing the first pump beam 17A to be incident on one measurement area 16A.

The first probe beam 26A is emitted from the light waveguide unit 29A provided on the case side surface 5c.

The case side surface 5c is perpendicular to the case side surfaces 5a and 5b. In other words, the angle between the case side surfaces 5a and 5c is a right angle. The first probe beam 26A travels in the normal direction of the cell side surface 2c. Then, since the case side surfaces 5a and 5c are perpendicular to each other, the traveling direction of the first pump beam 17A and the traveling direction of the first probe beam 26A are also perpendicular to each other. The first probe beam 26A that has passed through the measurement area 16A reaches the mirror 37A provided on the case side surface 5d. The first probe beam 26A reaching the mirror 37A is reflected by the mirror 37A. The first probe beam 26A acquires information on the magnetic field when passing through the alkali metal vapor present in the measurement area 16A. The first probe beam 26A having acquired the information on the magnetic field is reflected by the mirror 37A. The reflected first probe beam 26A passes through the alkali metal vapor present in the measurement area 16A again. When passing through the alkali metal vapor, the first probe beam 26A acquires the information on the magnetic field again. Then, the first probe beam 26A returns to the light waveguide unit 29A. Therefore, the cell 2 has an input surface for receiving the first probe beam 26A and an output surface for extracting the first probe beam 26A for one measurement area 16A. The input surface and the output surface may be common as in the present disclosure. In this case, an optical component (that is, the mirror 37A) for controlling the traveling direction of the first probe beam 26A is required.

[Function and Effect] The cell module 5 includes the cell 2 in which the alkali metal is enclosed, and the heater 14 that heats the alkali metal. The cell 2 and the heater 14 are accommodated in the case 43 that forms the decompression region 44S. According to this arrangement, the cell 2 and the heater 14 are disposed in the decompression region 44S. As a result, the heat generated by the cell 2 and the heater 14 becomes difficult to move to the case 43. That is, due to the decompression region 44S, a space between the case 43 and the cell 2 is thermally insulated, and a space between the case 43 and the heater 14 is thermally insulated. Therefore, the temperature rise of the case 43 is suppressed. As a result, the cell module 5 (cell 2) can be brought close to the measurement object. Therefore, the cell module 5 enables highly sensitive magnetic field measurement for various measurement objects. In other words, the cell module 5 enables highly sensitive magnetic field measurement on the measurement object that has limitations on the temperature at the time of measurement. As the examples of measurement objects having limitations on temperature conditions, the measurement object of which characteristics change, for example, in a living body and under a high temperature environment may be exemplified. In addition, the cell module 5 can suppress the temperature rise of the case 43. Therefore, the alkali metal in the interior of the cell 2 can be set to a desired high temperature. As a result, the detection sensitivity can be improved.

In the cell module 5, the decompression region 44S is a vacuum region. Due to the vacuum insulation effect exhibited by the decompression region 44S, the heat generated by the cell 2 and the heater 14 becomes even more difficult to move to the case 43. In addition, the decompression region 44S can suppress a gas or the like existing outside the cell 2 from infiltrating into the interior of the cell 2. As a result, since the change in detection sensitivity is suppressed, stable magnetic field measurement becomes possible.

The heater 14 of the cell module 5 is thermally coupled to the cell side surface 2b of the cell 2. In addition, the heater 14 is disposed so as to be separated from the inner surface 44K of the case main body 44 (case 43). Due to such an arrangement, the heat generated by the heater 14 is reliably applied to the cell 2. Furthermore, due to the decompression region 44S interposed between the heater 14 and the case 43, the heat generated by the heater 14 is difficult to move from the heater 14 to the case 43. More specifically, the heater 14 is fixed to the cell 2 in the entire region constituting the heat generation portion. More specifically, the heater 14 is separated from the inner surface 44K and in surface contact with the cell side surface 2b. For this reason, the heat generated by the heater 14 is reliably applied to the cell 2. Furthermore, the thermal connection portion between the heater 14 and the case 43 is only a feeder line for the terminal 51. Therefore, the heat generated by the heater 14 is difficult to move from the heater 14 to the case 43.

The cell module 5 further includes the support portion 52. The support portion 52 supports the cell 2 in the interior of the case 43 so that the cell side surfaces 2a, 2b, 2c, and 2d of the cell 2 are separated from the inner surface 44K of the case 43. Due to the support portion 52, the cell side surfaces 2a, 2b, 2c, and 2d are not in direct contact with the inner surface 44K of the case 43. Therefore, the heat movement from the cell 2 to the case 43 caused by the direct contact is further suppressed. As a result, the set temperatures of the cell 2 and the heater 14 can be further increased, so that the detection sensitivity can be improved.

The cells 2 of the cell module 5 have a shape extending in a predetermined axial direction. The cell 2 includes the magnetic field incident portion 12A at one end side in the axial direction. Furthermore, the cell 2 is supported by the support portion 52 at the other end side in the axial direction. Due to the support portion 52, the heat movement from the magnetic field incident portion 12A to the case 43 through the support portion 52 is suppressed. That is, by providing the support portion 52 on the end portion side separated from the magnetic field incident portion 12A without providing the support portion 52 on the side closer to the magnetic field incident portion 12A, the magnetic field incident portion 12A and the measurement area 16A adjacent to the magnetic field incident portion 12A can be maintained at a high temperature. Furthermore, the temperature rise of the case 43 in the area close to the measurement object can be suppressed.

The case 43 of the cell module 5 is a heat insulating member provided on the inner surface 44K of the case 43. The case 43 has the radiation heat reflection film 53 that reflects the radiation heat from the cell side surfaces 2a, 2b, 2c, and 2d. The factor of the heat movement in the decompression region 44S includes radiation from the cell side surfaces 2a, 2b, 2c, and 2d to the inner surface 44K of the case 43. Therefore, the radiation heat reflection film 53 is provided on the inner surface 44K of the case 43 receiving the radiation heat. As a result, the heat movement by radiation from the cell 2 to the case 43 can be further reduced. In particular, the cell module 5 has a structure in which direct contact and thermal coupling between the cell 2 and the case 43 and between the heater 14 and the case 43 are suppressed as much as possible by the decompression region 44S, the support portion 52, and the like. Therefore, the heat insulation effect can be reliably obtained by suppressing the radiation heat through the space.

Heretofore, although the present invention is described, the present invention may be implemented in various forms without being limited to the structure of the present invention.

REFERENCE SIGNS LIST

1: optically pumped magnetic sensor, 2: cell, 2a: cell side surface, 2b, 2d: cell side surface, 2c: cell side surface, 5: cell module, 8: glass substrate, 12: glass main body portion, 14: heater, 16A: measurement area, 17A: first pump beam, 26A: first probe beam, 29A, 29B: light waveguide unit, 37A, 37B: mirror, 43: case, 44: case main body, 46: lid, 44S: decompression region, 44T: opening, 49: sealing material, 44K: inner surface, 51: terminal, 52: support portion, 53: radiation heat reflection film, 53a, 53b: window hole.

What is claimed is:

1. A cell module for an optically pumped magnetic sensor, comprising:
 a cell in which an alkali metal is enclosed;
 a heating unit which is disposed close to the cell to heat the alkali metal; and
 an accommodation unit which forms a decompression region accommodating the cell and the heating unit.

2. The cell module for the optically pumped magnetic sensors according to claim 1, wherein the decompression region is a vacuum region.

3. The cell module for the optically pumped magnetic sensor according to claim 1, wherein the heating unit is thermally coupled to an outer surface of the cell and disposed so as to be separated from an inner surface of the accommodation unit.

4. The cell module for the optically pumped magnetic sensor according to claim 1, further comprising a support portion which supports the cell in the accommodation unit so that an inner surface of the accommodation unit and an outer surface of the cell are separated from each other.

5. The cell module for the optically pumped magnetic sensor according to claim 4, wherein the cell has a shape extending in a predetermined axial direction, includes a magnetic field incident portion at one end side in the axial direction, and is supported by the support portion at other end side in the axial direction.

6. The cell module for the optically pumped magnetic sensor according to claim 1, further comprising a heat insulating member which is disposed between an inner surface of the accommodation unit and an outer surface of the cell.

7. The cell module for the optically pumped magnetic sensor according to claim 6, wherein the heat insulating member is a radiation heat reflection member which reflects radiation heat from the outer surface of the cell.

\* \* \* \* \*